(12) United States Patent
Tonda

(10) Patent No.: US 6,233,186 B1
(45) Date of Patent: May 15, 2001

(54) MEMORY DEVICE HAVING REDUCED PRECHARGE TIME

(75) Inventor: Yasuhiro Tonda, Kanagawa (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/457,579

(22) Filed: Dec. 9, 1999

(30) Foreign Application Priority Data

Dec. 11, 1998 (JP) .................................................. 10-352280

(51) Int. Cl.[7] .................................................. G11C 7/00
(52) U.S. Cl. .......................... 365/203; 365/94; 365/207; 365/185.21; 365/189.07
(58) Field of Search ........................ 365/203, 94, 207, 365/185.21, 189.07, 185.01, 189.01

(56) References Cited

U.S. PATENT DOCUMENTS

| Re. 36,579 | * | 2/2000 | Pascucci et al. | 365/185.21 |
| 4,933,906 | * | 6/1990 | Terada et al. | 365/208 |
| 5,148,063 | * | 9/1992 | Hotta | 365/185.21 |
| 5,949,727 | * | 2/2000 | Choi et al. | 365/203 |

FOREIGN PATENT DOCUMENTS

| 2-91893 | 3/1990 | (JP) | G11C/16/06 |
| 3-5299 | 1/1991 | (JP) | G11C/16/06 |
| 6-36581 | 2/1994 | (JP) | G11C/16/06 |
| 7-21775 | 1/1995 | (JP) | G11C/11/41 |

* cited by examiner

Primary Examiner—David Nelms
Assistant Examiner—Hoai V. Ho
(74) Attorney, Agent, or Firm—Hayes, Soloway, Hennessey, Grossman & Hage, P.C.

(57) ABSTRACT

A ROM includes a sense amplifier implemented by a current mirror circuit having a data line, a memory cell array, a plurality of digit lines and column selector for coupling the data line to one of the digit lines. The precharge circuit couples the data line to the ground during an initial stage of the precharge period to precharge the data line before the column selector couples the data line to the one of the digit lines, and also precharges the digit line through the data line after the column selector selects the digit line. A higher precharge operation can be achieved by the standby mode of the precharge circuit while precharging the data line.

11 Claims, 6 Drawing Sheets

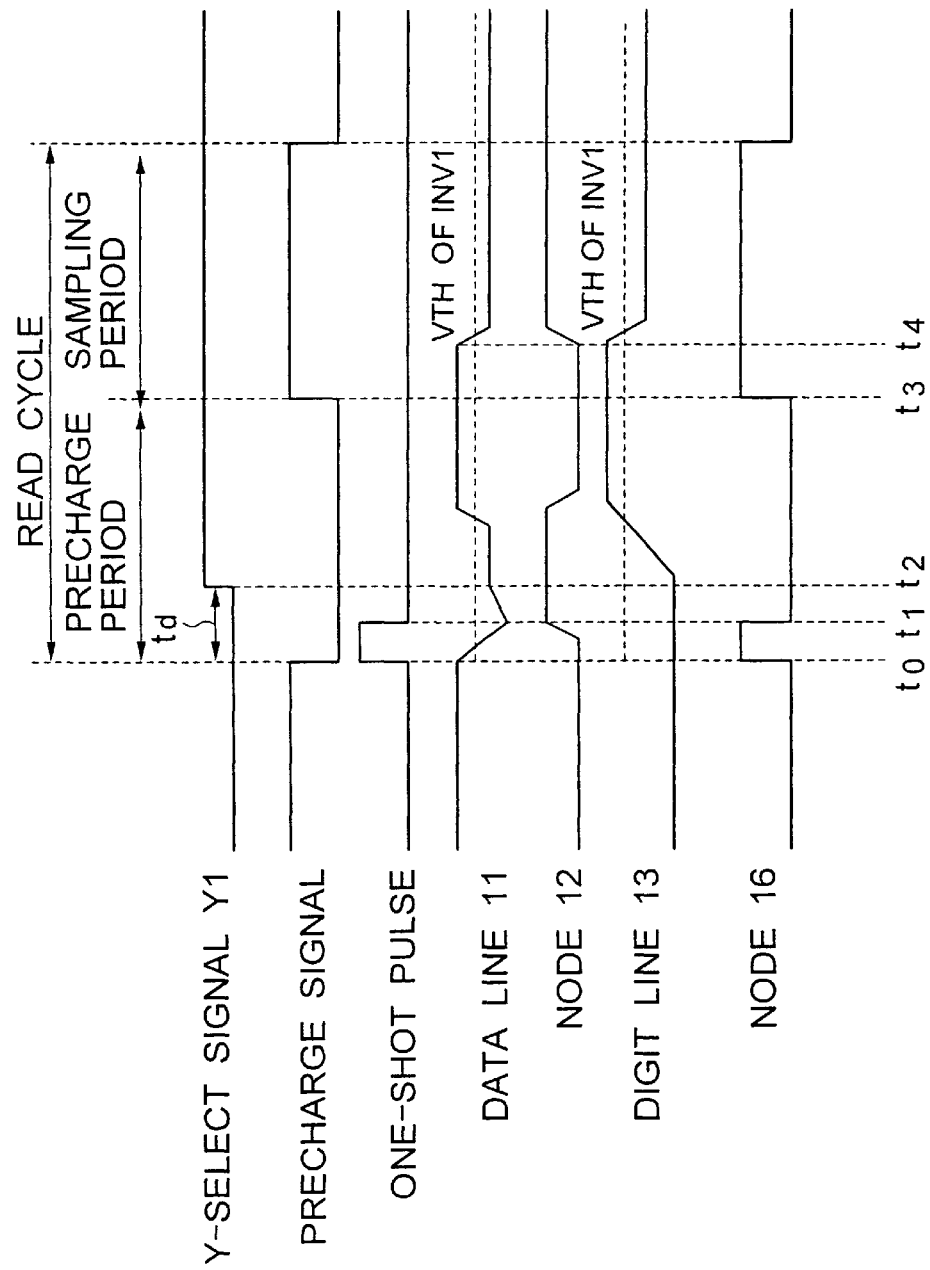

MEMORY DEVICE HAVING REDUCED PRECHARGE TIME

BACKGROUND OF THE INVENTION (a) Field of the Invention

The present invention relates to a semiconductor memory device having a reduced precharge time and, more particularly, to an improvement of a precharge circuit in the semiconductor memory device.

(b) Description of a Related Art

Some memory devices include a read circuit having a sense amplifier implemented by a current mirror circuit. FIG. 1 shows a ROM having such a read circuit. The ROM includes a sense amplifier 201 having a data line 11, a column selector (Y-selector) 202 and a memory cell array 203.

The memory cell array 203 includes a plurality of memory cells arranged in a matrix and each including a cell transistor such as MA or MB having a source connected to the ground, a drain connected to a bit line (digit line) 13, and a gate connected to a corresponding word line W1. Each memory cell MA or MB is programmed in the fabrication process thereof to have an on-state or an off-state during activation thereof depending on the data stored. The Y-selector 202 includes for each column an n-channel (n-ch) transistor such as N1 or N2 having a gate for receiving a column select signal (Y-select signal) such as Y1 or Y2, a source connected to a corresponding digit line 13, and a drain connected to the data line 11 in common with the drains of other n-ch transistors.

The sense amplifier 201 includes a precharge circuit implemented by a p-ch transistor P1 having a source connected to a source line VDD (VDD line), a gate for receiving a precharge signal and a drain connected to a node 14, and a current mirror circuit including a reference-side p-ch transistor P2 having a source connected to the source line VDD and a gate and a drain connected together to node 14 and an output-side p-ch transistor P3 having a source connected to the source line VDD and a gate connected to the gate of p-ch transistor P2 at node 14.

The sense amplifier 201 further includes an n-ch transistor N3 having a drain connected to the drain of p-ch transistor P2 at node 14, a gate connected to the output node 12 of a feed-back inverter INV1 and a source connected to the common drains of the n-ch transistors N1 and N2 of the Y-selector 202 through the data line 11, and an n-ch transistor N4 having a drain connected to the drain of p-ch transistor P3 at a node 15, a gate connected to a reference voltage line and a source connected to the ground line. The input of feed-back inverter INV1 is connected to the data line 11, and the drain of n-ch transistor N4 is connected to an output terminal OUT through an inverter INV2.

FIG. 2 shows a timing chart showing the operation of the ROM of FIG. 1. A single read cycle of the ROM includes a precharge period for precharging a selected digit line 13, and a sampling period for reading data from the selected memory cell through the digit line 13 and the data line 11.

The setting of the read cycle is such that the precharge signal falls from a high level to a low level at time t0 to effect a start of precharge period, followed by, after a time delay td, a rise of the Y-select signal from a low level to a high level. More specifically, the precharge signal is activated at the start of the precharge period, whereas the Y-select signal changes after the time delay td elapsed since the change of the precharge signal due to the delay of the Y-decoder (column decoder).

After Y-select signal Y1, for example, rises from a low level to a high level, the charge stored on the data line 11 flows to the digit line 13 to start charging of the digit line 13, which causes a fall of the potential of the data line 11.

After the potential of the digit line 11 falls below the threshold level of feed-back inverter INV1, the output node 12 of feed-back inverter INV1 rises from a low level to a high level to turn on n-ch transistor N3. Thus, the precharge current flows through p-ch transistor P1 and n-ch transistor N3, both of which are turned on at this stage, from the VDD line to the digit line 13. After the digit line 13 is charged, the node 14 connecting the drain and the gate of p-ch transistor P2 is charged up to the VDD level.

Subsequently, the precharge signal rises from the low level to a high level at time t3 to effect a data sampling period, wherein p-ch transistor P1 is turned off. If memory cell "MA" having an on-state as the stored data thereof is selected at this read cycle, the potential of node 14 falls from the VDD level to a lower level, which is lower than VDD-Vth, to turn on p-ch transistor P2 and p-ch transistor P3, wherein given Vth is the threshold voltage of p-ch transistors.

Since the transconductance ($g_m$) of p-ch transistor P3 is set higher than the transconductance of n-ch transistor N4, the drain (node 15) of p-ch transistor P3 rises to a high level, whereby the data supplied through output terminal OUT assumes a low level.

In the conventional ROM as described above, there is a problem in that the read cycle requires a relatively long time for the precharge period especially if the ROM has a large storage capacity, i.e., if the ROM has a large number of memory cells, to thereby lower the speed of the read operation.

More specifically, a larger storage capacity of the ROM involves a larger number of memory cells connected to a digit line,. which increases the parasitic capacitance for the drains of memory cells and thus increases the load capacitance and the load resistance of the digit line, resulting in the increase of the precharge time.

SUMMARY OF THE INVENTION

It is therefore an object of the present invention to provide a semiconductor memory device having a higher operational speed in the read cycle of the semiconductor memory device by reducing the time length for the precharge period.

The present invention provides a semiconductor memory device having a memory cell array including a plurality of memory cells each having a cell transistor for storing data therein, a plurality of digit lines each disposed for a corresponding column of the memory cells for reading stored data therethrough, a plurality of word lines each disposed for a corresponding row of the memory cells, a sense amplifier having a data line and responding to a sampling signal to read data stored in a selected memory cell through the data line, a column selector for responding to a precharge signal to selectively couple the data line to one of the digit lines, and a precharge circuit for precharging the data line before the column selector couples the data line to the one of the digit lines and precharging one of the digit lines through the data line after the column selector selects the one of the digit lines.

In accordance with the semiconductor memory device of the present invention, the precharge circuit precharges the data line before the column selector couples the data line to the one of the digit lines, and precharges the selected digit line through the data line after the column selector couples the data line to the one of the digit lines. This provides a higher operational speed of the precharge circuit precharging the digit line, and thus affords a higher operational speed of overall operation of the memory device.

The above and other objects, features and advantages of the present invention will be more apparent from the following description, referring to the accompanying drawings.

BRIEF DESCRIPTION OF THE DRAWINGS

FIG. 6 is a timing chart of the operation of the ROM of FIG. 5.

PREFERRED EMBODIMENTS OF THE INVENTION

Figure 1:
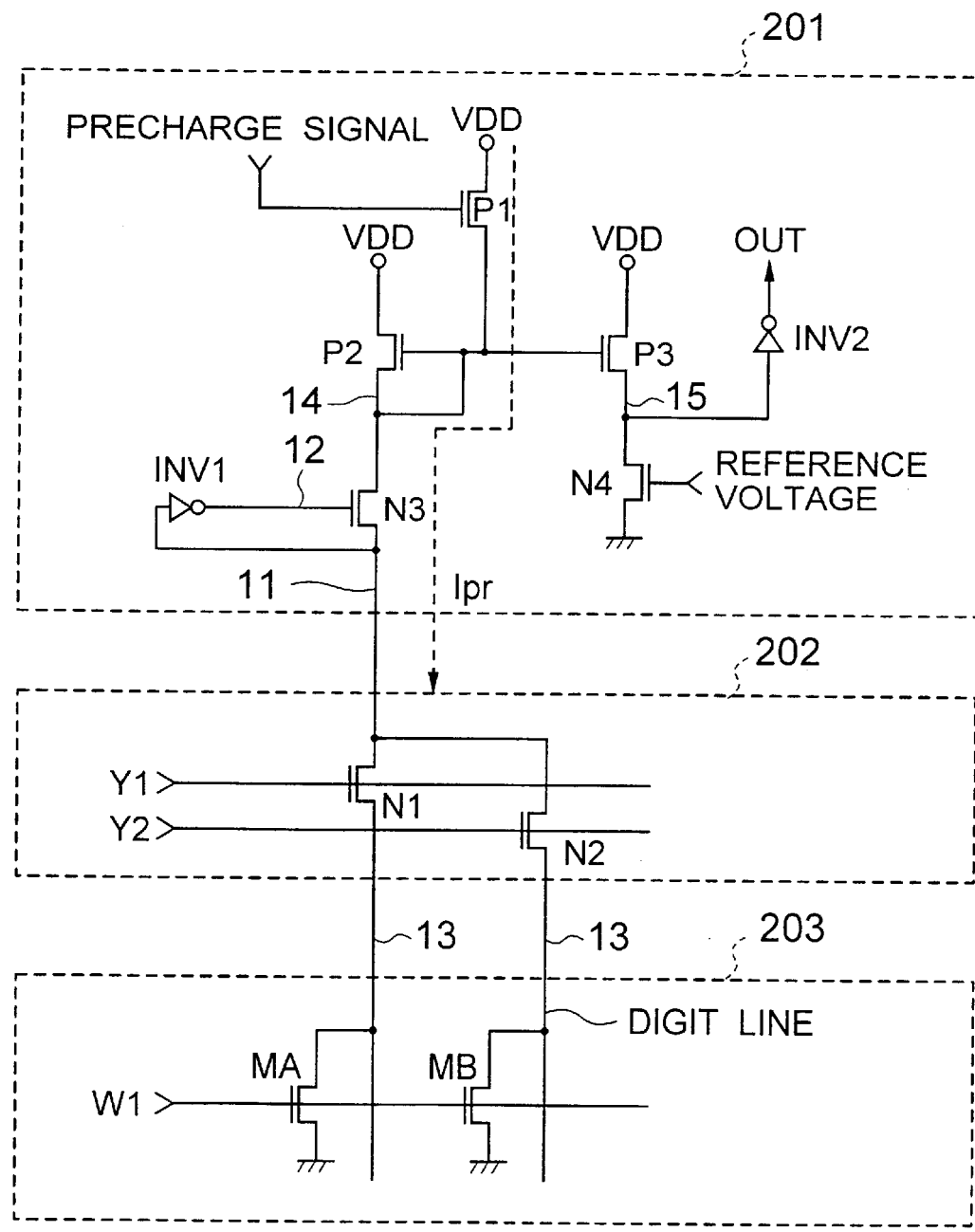
FIG. 1 is a schematic diagram of a conventional ROM.
Figure 2:
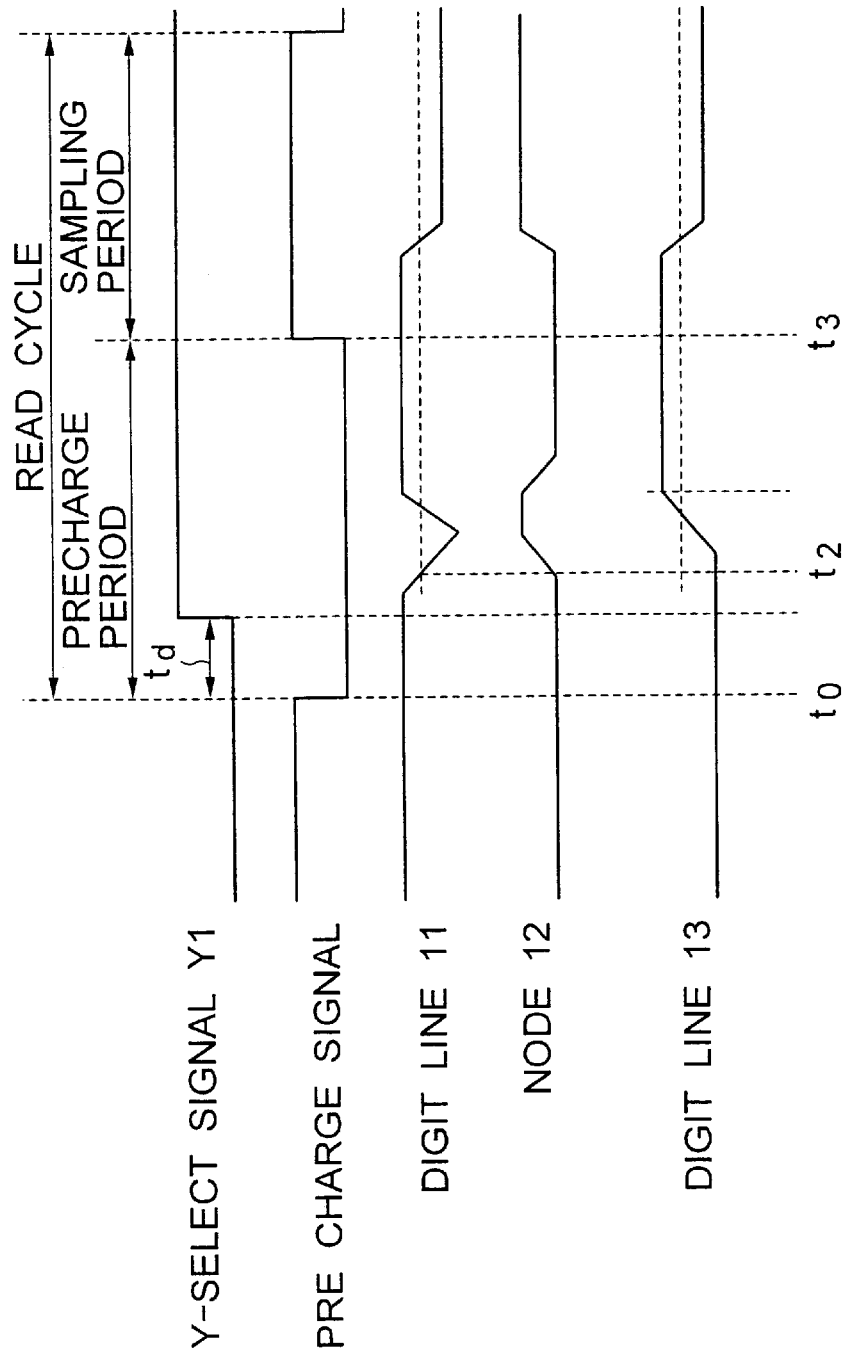
FIG. 2 is a timing chart of the operation of the ROM of FIG. 1.

Now, the present invention is more specifically described with reference to accompanying drawings, wherein similar constituent elements are designated by similar reference numerals throughout the drawings.

Figure 3:
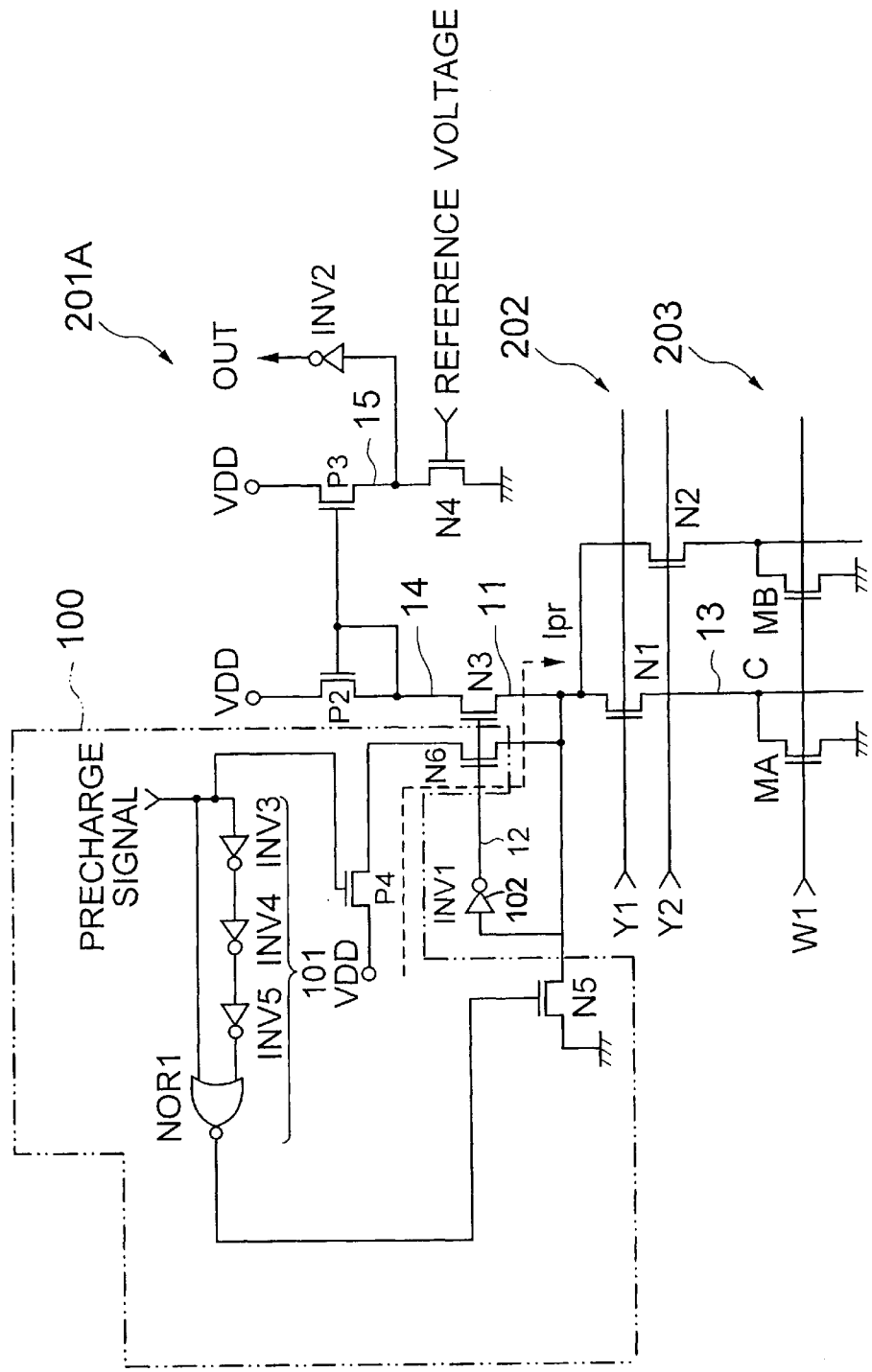
FIG. 3 is a schematic diagram of a ROM according to a first embodiment of the present invention.

Referring to FIG. 3, a ROM implementing a semiconductor memory device according to a first embodiment of the present invention includes a precharge circuit block 100, in addition to a sense amplifier 201A, a Y-selector 202 and a memory cell array 203 which are similar to those in the conventional ROM described with reference to FIG. 1 except for the precharge transistor P1 and the connection for feed-back inverter INV1.

More specifically, the memory cell array 203 in the present embodiment has a plurality of memory cells each including a cell transistor such as MA or MB having a source connected to the ground line, a drain connected to a corresponding digit line 13, and a gate connected to a corresponding word line such as W1. Each cell transistor has a ROM data therein, wherein an on-state and off-state of the cell transistor during activation of the gate thereof correspond to "0" and "1", respectively. In this example, memory cell MA has data "0" and memory cell MB has data "1".

The Y-selector 202 includes for each column an n-ch transistor such as N1 or N2 having a gate for receiving a Y-select signal Y1 or Y2, a source connected to a corresponding digit line 13 and a drain connected to a data line 11 in common with the drains of other n-ch transistors.

The sense amplifier 201A includes a current mirror circuit including a reference-side p-ch transistor P2 having a source connected to the source line VDD and a gate and a drain connected together at node 14 and an output-side p-ch transistor P3 having a source connected to the source line VDD and a gate connected to the gate of p-ch transistor P2 at node 14.

The sense amplifier 201A further includes an n-ch transistor N3 having a drain connected to the drain of p-ch transistor P2 at node 14, a gate connected to the output node 12 of a feed-back inverter 102 and a source connected to the common drains of the n-ch transistors N1 and N2 of the Y-selector 202 through the data line 11, and an n-ch transistor N4 having a drain connected to the drain of p-ch transistor P3 at node 15, a gate connected to a reference voltage line and a source connected to the ground line. The input of feed-back inverter 102 is connected to the data line 11, and the drain of n-ch transistor N4 is connected to an output terminal OUT through an inverter INV2.

The precharge circuit block 100 includes a one-shot pulse generator 101 for generating a one-shot pulse by responding to an active level of the precharge signal, an n-ch transistor N5 having a gate for receiving the one-shot pulse, a source connected to the ground line, a drain connected to the data line 11, the input of inverter 102 and the source of n-ch transistor N3, an n-ch transistor N6 having a gate connected to the output node 12 of feed-back inverter 102, a source connected to the data line 11, and a p-ch transistor P4 having a gate for receiving the precharge signal, a source connected to the VDD line and a drain connected to the drain of n-ch transistor N6.

The one-shot generator 101 includes a plurality (odd number) of cascaded inverters INV3, INV4 and INV5 for receiving the precharge signal as the input thereof, and a NOR gate NOR1 having a first input for receiving the precharge signal and a second input connected to the output of the cascaded inverters INV3, INV4 and INV5. The one-shot generator 101 responds to the falling edge of the precharge signal to generate a one-shot pulse having a small duration at the initial stage of the precharge period.

In operation, when the precharge signal assumes an active level (low level), a one-shot pulse is generated in the one-shot pulse generator 101, whereby n-ch transistor N5 is tuned on to discharge the digit line 12 toward the ground line for a small period of time. This lowers the input potential of feed-back inverter 102 to the ground level, which makes n-ch transistor N6 and p-ch transistor P4 to turn on, whereby the digit line 12 enters a standby mode while being precharged from the VDD line by n-ch transistor N6 and p-ch transistor P4. In this state, Y-select signal Y1, for example, rises from a low level to a high level to turn on n-ch transistor N1, and at the same time a precharge current $I_{pr}$ flows from the VDD line through p-ch transistor P4, n-ch transistor N6 and data line 11 to the digit line 13 for precharging the digit line 13. The standby mode while effecting a precharge operation can reduce the time length for the precharge period of the selected digit line and enables a higher speed for a read-out operation of stored data by reducing the design precharge period in the ROM. Although the precharge of the digit line is also effected by p-ch transistor P2, the precharge current supplied through p-ch transistor P2 is lower compared to the precharge current supplied through p-channel transistor P4 and n-ch transistor N6 due to a difference of the transistor size therebetween.

Figure 4:
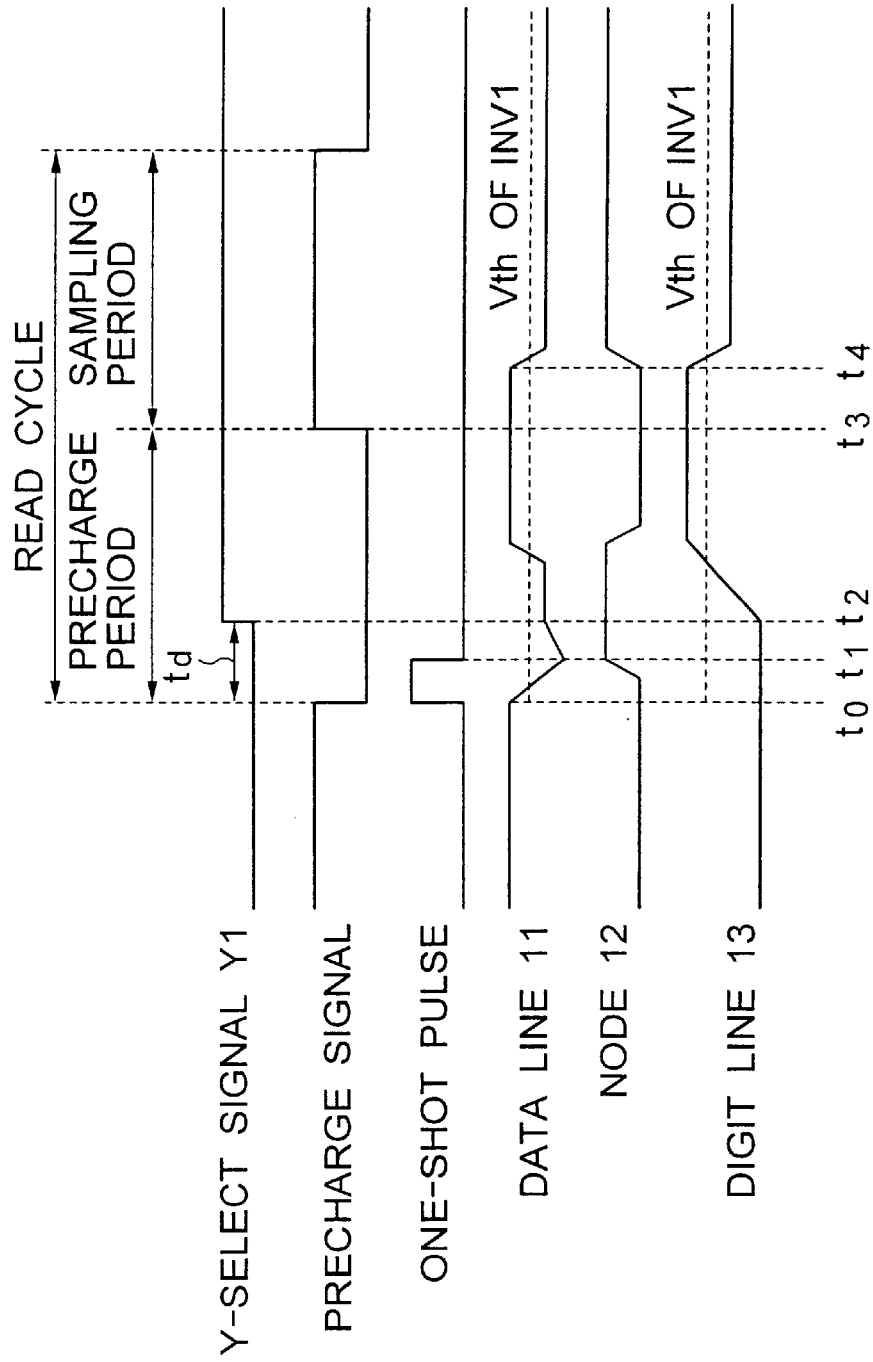
FIG. 4 is a timing chart of the operation of the ROM of FIG. 3.

The operation of the ROM of FIG. 3 will be more specifically described with reference to the timing chart shown in FIG. 4. When the precharge signal falls from a high level to a low level (active level) at time t0 to effect a precharge period, the output of NOR gate NOR1 in the one-shot pulse generator 101 rises to a high level because both the inputs thereof assumes a low level at a small time interval between t0 and t1, the time interval being equal to the time delay of the plurality of cascaded inverters INV3, INV4 and INV5. Thus, n-ch transistor N5 turns on to start for lowering the potential of the data line 11 from a high level toward the ground level.

When the potential of the data line 11 becomes lower than the threshold level of feed-back inverter INV1, the output node 12 of feed-back inverter assumes a high level, whereby n-ch transistors N3 and N6 turn on. At this stage, p-ch transistor P4 is also on due to the low level of the precharge signal and accordingly, the data line 11 is precharged from the VDD line through p-ch transistor P4 and n-ch transistor N6. After the delay time of the plurality of cascaded inverters elapses at time t1 since the start of the precharge period at t0, the output of NOR gate NOR1 again assumes a low level to turn off n-ch transistor N5.

When Y-select signal Y1 rises from a low level to a high level at time t2, n-ch transistor N1 turns on to charge the digit line 13 from the VDD line through p-ch transistor P4, n-ch transistor N6 and the digit line 11 until the precharge of the digit line 13 is completed.

Subsequently, the precharge signal rises from the low level to a high level at time t3 to switch the ROM from the precharge period to a data sampling period, wherein n-ch transistor P4 is turned off. At this stage, since the cell transistor of memory cell MA selected by the row address signal W1 has data "0" corresponding to an on-state thereof, the digit line 13 as well as the data line 11 and node 14 is discharged to assume a low level, which is lower than VDD-Vth wherein Vth is the threshold voltage of p-ch transistors, thereby turning on p-ch transistors P2 and P3 at time t4.

Since the transconductance of p-ch transistor P3 is higher than the transconductance of n-ch transistor N4, node 15 assumes a high level at this stage, whereby the data output from inverter INV2 assumes a low level, which means that the data stored in the selected memory cell MA is read as data "0". On the other hand, if memory cell MB storing data "1" is selected at the read cycle, the data line 11 stays at a high level and p-ch transistors P2 and P3 are off, whereby the data output from inverter assumes a high level, which means the data stored in the selected memory cell is "1".

As described above, by the function of the one-shot pulse generator 101 and n-ch transistor N5 receiving the output pulse of the one-shot pulse generator, the data line 11 is lowered toward the ground level prior to the selection of the digit line 13 by the Y-selector 202, and waits the selection of the digit line while being precharged. Thus, when the Y-selector 202 selects the digit line 13 after some delay from the start of the precharge period, the precharge transistors N6 and P4, which are on at this stage, can precharge the digit line 13 from the instant of the ON of the Y-selector 202, whereby the precharge period can be reduced. In the conventional ROM, the precharge transistor P1 turns on after the potential of the data line 11 is lowered by a large parasitic capacitance of the digit line 13 down to the threshold level of feed-back inverter, whereby there is a time delay between the time instants of turn-on of the Y-selector 202 and the turn-on of p-ch precharge transistor P1.

In addition, since the potential of node 14 stays at a level slightly higher than the threshold of feed-back inverter INV1 at the end of the precharge period, the potential of node 14 can be detected by the sense amplifier 201A when the potential of node 14 is lowered below the threshold of feed-back inverter INV1 only by a small amount which the sense amplifier can detect. This enables the potential amplitude of node 14 to be lowered compared to the conventional ROM where the potential of node 14 is raised up to the VDD level, thereby further improving the operational speed of the ROM.

Figure 5:
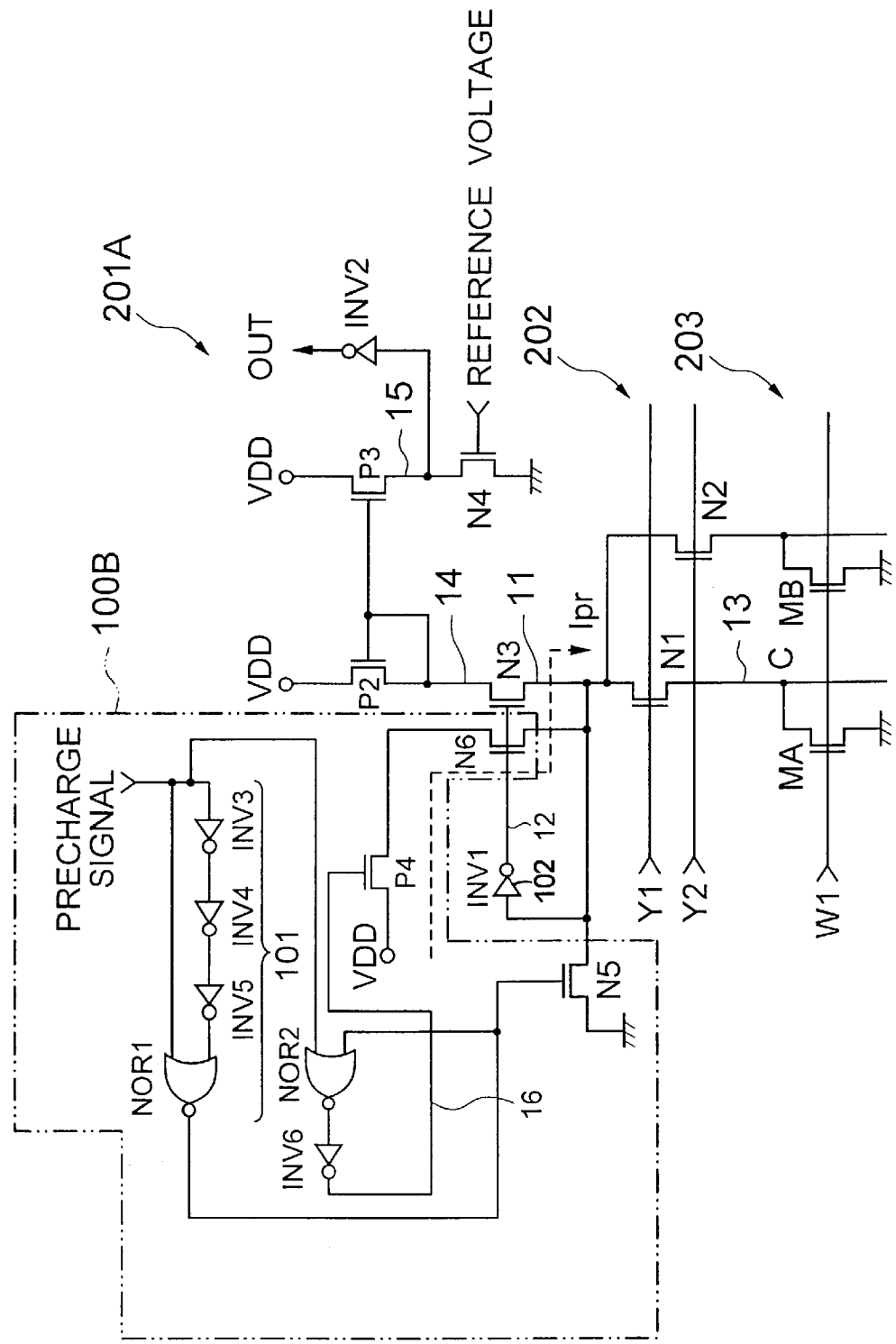
FIG. 5 is a schematic diagram of a ROM according to a second embodiment of the present invention.

Referring to FIG. 5, a ROM according to a second embodiment of the present invention is similar to the first embodiment except for the configuration of the precharge circuit block 100B. The precharge circuit block 100B includes a one-shot pulse generator 101, p-ch transistor P4, n-ch transistors N5 and N6 which are similar to those in the first embodiment, and a NOR gate NOR2 having a first input for receiving the precharge signal and a second input connected to the output of the one-shot pulse generator 101, an inverter INV6 having an input connected to the output of NOR gate NOR2 and an output connected to the gate of p-ch transistor P4.

FIG. 6 shows the timing chart of the operation of the ROM of FIG. 5. After the precharge signal falls from a high level to a low level at time t0, the one-shot pulse generator 101 generates a one-shot pulse while both the inputs thereof assume a low level between time instants t0 and t1. At this stage, the output of NOR gate NOR2 assumes a low level, the output of inverter INV6 assumes a high level, and thus p-ch transistor P4 is off.

Since n-ch transistor N5 is on during the time period for the one-shot pulse, the potential of the data line 11 is lowered. When the potential of the data line 11 falls below the threshold level of feed-back inverter INV1, the output node 12 of feed-back inverter INV1 assumes a high level, whereby n-ch transistors N3 and N6 turn on.

Since p-ch transistor P4 is off at this stage, a precharge current path passing p-ch transistor P4, n-ch transistor N6 and n-ch transistor N5 is not formed from the VDD line to the ground in this embodiment. When the output of plurality of inverters INV3, INV4 and INV5 assumes a high level at time t1 after a time delay from the start of the precharge period, the output of the one-shot pulse generator 101 returns to a low level and the output of NOR gate NOR2 assumes a low level, whereby p-ch transistor P4 turns on for precharging the data line 11.

When the Y-select signal Y1 rises at time t2 from a low level to a high level, n-ch transistor N1 is turned on, whereby the electric charge flows from the VDD line through p-ch transistor P4, n-ch transistor N6, the data line 11 and n-ch transistor N1 to the digit line 13 for precharge of the digit line 13.

Subsequently, when the precharge signal rises at time t3 from the low level to a high level to switch the ROM from the precharge period to a data sampling period, p-ch transistor P4 turns off. Since memory cell MA, programmed at an on-state, is selected, the node 14 is lowered below VDD-|Vth| at time t4, thereby turning on p-ch transistors P2 and P3. Thus, node 15 assumes a high level to output a low level through output terminal OUT.

In the second embodiment, since p-ch transistor P4 is off between t0 and t1 during the duration of the one-shot pulse, the data line 11 can be lowered to the ground level without being supplied with current from the VDD line. Thus, a lower power dissipation can be achieved in the present embodiment compared to the first embodiment.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising a memory cell array including a plurality of memory cells each having a cell transistor for storing data therein, a plurality of digit lines each disposed for a corresponding column of said memory cells for reading stored data therethrough, a plurality of word lines each for disposed for a corresponding row of said memory cells, a sense amplifier having a data line and responding to a sampling signal to read data stored in a selected memory cell through said data line, a column selector for responding to a precharge signal to selectively couple said data line to one of said digit lines, and a precharge circuit for precharging said data line before said column selector couples said data line to said one of said digit lines, and for precharging one of said digit lines through said data line after said column selector couples said data line to said one of said digit lines, whereupon precharge time is reduced.

2. The semiconductor memory device as defined in claim 1, wherein said precharge circuit includes a one-shot pulse generator for responding to an active level of said precharge signal to generate a one-shot pulse, first and second transistors connected in series between a first source line and said data line, and a third transistor connected between said data line and a second source line, said first transistor being turned on by an active level of said precharge signal, said third transistor responding to said one-shot pulse to discharge said data line toward said second source line, said second transistor being turned on by a low level of said data line.

3. The semiconductor memory device as defined in claim 1, wherein said precharge circuit includes a one-shot pulse generator for responding to an active level of said precharge signal to generate a one-shot pulse, first and second transistors connected in series between a first source line and said data line, and a third transistor connected between said data line and a second source line, said first transistor being turned on by an active level of said precharge signal except for a duration of said one-shot pulse, said third transistor responding to said one-shot pulse to discharge said data line toward said second source line, said second transistor being turned on by a low level of said data line.

4. The semiconductor memory device as defined in claim 1, wherein said sense amplifier is implemented by a current mirror circuit including a reference-side transistor having a gate and drain connected together and an output-side transistor having a gate connected to the gate of said reference transistor, and another transistor connected between said reference-side transistor and said data line.

5. The semiconductor memory device as defined in claim 1, wherein said memory cells are read-only-memory cells.

6. A semiconductor memory device comprising a memory cell array including a plurality of memory cells each having a cell transistor for storing data therein, a plurality of digit lines each disposed for a corresponding column of said memory cells for reading stored data therethrough, a plurality of word lines each for disposed for a corresponding row of said memory cells, a sense amplifier having a data line and responding to a sampling signal to read data stored in a selected memory cell through said data line, a column selector for responding to a precharge signal to selectively couple said data line to one of said digit lines, and a precharge circuit for precharging said data line before said column selector couples said data line to said one of said digit lines and precharging one of said digit lines through said data line after said column selector couples said data line to said one of said digit lines, wherein said precharge circuit includes a one-shot pulse generator for responding to an active level of said precharge signal to generate a one-shot pulse, first and second transistors connected in series between a first source line and said data line, and a third transistor connected between said data line and a second source line, said first transistor being turned on by an active level of said precharge signal, said third transistor responding to said one-shot pulse to discharge said data line toward said second source line, said second transistor being turned on by a low level of said data line.

7. The semiconductor memory device as defined in claim 6, wherein said sense amplifier is implemented by a current mirror circuit including a reference-side transistor having a gate and drain connected together and an output-side transistor having a gate connected to the gate of said reference transistor, and another transistor connected between said reference-side transistor and said data line.

8. The semiconductor device as defined in claim 6, wherein said memory cells are read-only memory cells.

9. A semiconductor memory device comprising a memory cell array including a plurality of memory cells each having a cell transistor for storing data therein, a plurality of digit lines each disposed for a corresponding column of said memory cells for reading stored data therethrough, a plurality of word lines each for disposed for a corresponding row of said memory cells, a sense amplifier having a data line and responding to a sampling signal to read data stored in a selected memory cell through said data line, a column selector for responding to a precharge signal to selectively couple said data line to one of said digit lines, and a precharge circuit for precharging said data line before said column selector couples said data line to said one of said digit lines and precharging one of said digit lines through said data line after said column selector couples said data line to said one of said digit lines, wherein said precharge circuit includes a one-shot pulse generator for responding to an active level of said precharge signal to generate a one-shot pulse, first and second transistors connected in series between a first source line and said data line, and a third transistor connected between said data line and a second source line, said first transistor being turned on by an active level of said precharge signal except for a duration of said one-shot pulse, said third transistor responding to said one-shot pulse to discharge said data line toward said second source line, said second transistor being turned on by a low level of said data line.

10. The semiconductor memory device as defined in claim 9, wherein said sense amplifier is implemented by a current mirror circuit including a reference-side transistor having a gate and drain connected together and an output-side transistor having a gate connected to the gate of said reference transistor, and another transistor connected between said reference-side transistor and said data line.

11. The semiconductor memory device as defined in claim 9, wherein said memory cells are read-only-memory cells.

* * * * *